(12) United States Patent
Zhou et al.

(10) Patent No.: US 9,590,494 B1
(45) Date of Patent: Mar. 7, 2017

(54) BRIDGELESS POWER FACTOR CORRECTION CIRCUITS

(71) Applicant: Transphorm Inc., Goleta, CA (US)

(72) Inventors: Liang Zhou, Goleta, CA (US); Yifeng Wu, Goleta, CA (US)

(73) Assignee: Transphorm Inc., Goleta, CA (US)

( * ) Notice: Subject to any disclaimer, the term of this patent is extended or adjusted under 35 U.S.C. 154(b) by 37 days.

(21) Appl. No.: 14/802,333

(22) Filed: Jul. 17, 2015

Related U.S. Application Data

(60) Provisional application No. 62/025,666, filed on Jul. 17, 2014.

(51) Int. Cl.
| | |
|---|---|
| H02M 7/06 | (2006.01) |
| H02M 1/42 | (2007.01) |
| H02M 7/217 | (2006.01) |
| G01R 1/20 | (2006.01) |
| G01R 19/00 | (2006.01) |

(52) U.S. Cl.
CPC .............. H02M 1/42 (2013.01); G01R 1/203 (2013.01); G01R 19/0092 (2013.01); H02M 7/06 (2013.01); H02M 7/217 (2013.01)

(58) Field of Classification Search
CPC ...... H02M 7/06; H02M 7/127; H02M 7/1555; H02M 7/1623; H02M 3/33592; H02M 1/081; H02M 1/088; Y02B 70/1475
USPC .................. 363/123–127; 327/109, 427, 434
See application file for complete search history.

(56) References Cited

U.S. PATENT DOCUMENTS

| | | |
|---|---|---|
| 4,321,489 A | 3/1982 | Higuchi et al. |
| 4,384,287 A | 5/1983 | Sakuma |
| 4,665,508 A | 5/1987 | Chang |
| 4,728,826 A | 3/1988 | Einzinger et al. |
| 4,808,853 A | 2/1989 | Taylor |
| 4,864,479 A | 9/1989 | Steigerwald et al. |
| 5,198,964 A | 3/1993 | Ito et al. |
| 5,379,209 A | 1/1995 | Goff |
| 5,493,487 A | 2/1996 | Close et al. |
| 5,637,922 A | 6/1997 | Fillion et al. |
| 5,767,573 A | 6/1998 | Noda et al. |

(Continued)

FOREIGN PATENT DOCUMENTS

| | | |
|---|---|---|
| CN | 1682445 | 10/2005 |
| CN | 1921148 | 2/2007 |

(Continued)

OTHER PUBLICATIONS

U.S. Appl. No. 11/856,695, filed Sep. 17, 2007, Gallium Nitride Diodes and Integrated Components.

(Continued)

*Primary Examiner* — Yemane Mehari

(74) *Attorney, Agent, or Firm* — Fish & Richardson P.C.

(57) ABSTRACT

A power factor correction circuit comprises a pair of III-N based switches coupled to a first reference ground, and an inductive component connected in series with a current sensing resistor. A first side of the current sensing resistor is coupled to a second reference ground which is electrically isolated from the first reference ground, and a second side of the current sensing resistor is coupled to a control circuit. The control circuit is also coupled to the second reference ground and is configured to measure current flowing through the inductive component during operation of the power factor correction circuit.

20 Claims, 11 Drawing Sheets

(56) References Cited

U.S. PATENT DOCUMENTS

| | | | |
|---|---|---|---|
| 5,789,951 A | 8/1998 | Shen et al. | |
| 5,952,856 A | 9/1999 | Horiguchi et al. | |
| 6,008,684 A | 12/1999 | Ker et al. | |
| 6,107,844 A * | 8/2000 | Berg .................. | H02M 7/5387 327/110 |
| 6,130,831 A | 10/2000 | Matsunaga | |
| 6,172,550 B1 | 1/2001 | Gold et al. | |
| 6,333,617 B1 | 12/2001 | Itabashi et al. | |
| 6,395,593 B1 | 5/2002 | Pendharkar et al. | |
| 6,434,019 B2 | 8/2002 | Baudelot et al. | |
| 6,455,905 B1 | 9/2002 | Perugupalli et al. | |
| 6,521,940 B1 | 2/2003 | Vu et al. | |
| 6,556,053 B2 | 4/2003 | Stanley | |
| 6,633,195 B2 | 10/2003 | Baudelot et al. | |
| 6,650,169 B2 | 11/2003 | Faye et al. | |
| 6,781,423 B1 | 8/2004 | Knoedgen | |
| 6,864,131 B2 | 3/2005 | Thornton | |
| 6,876,235 B2 | 4/2005 | Li et al. | |
| 6,900,657 B2 | 5/2005 | Bui et al. | |
| 6,975,023 B2 | 12/2005 | Oliver et al. | |
| 7,116,567 B2 | 10/2006 | Shelton et al. | |
| 7,193,396 B2 | 3/2007 | Orr | |
| 7,199,636 B2 | 4/2007 | Oswald et al. | |
| 7,199,640 B2 | 4/2007 | De Cremoux et al. | |
| 7,212,063 B2 | 5/2007 | Münzer et al. | |
| 7,227,198 B2 | 6/2007 | Pavier et al. | |
| 7,239,108 B2 | 7/2007 | Best | |
| 7,304,331 B2 | 12/2007 | Saito et al. | |
| 7,348,687 B2 | 3/2008 | Aichriedler et al. | |
| 7,368,980 B2 | 5/2008 | Benelbar et al. | |
| 7,375,407 B2 | 5/2008 | Yanagihara et al. | |
| 7,378,883 B1 | 5/2008 | Hsueh | |
| 7,382,001 B2 | 6/2008 | Beach | |
| 7,417,257 B2 | 8/2008 | Beach et al. | |
| 7,443,648 B2 | 10/2008 | Cutter et al. | |
| 7,449,730 B2 | 11/2008 | Kuraguchi | |
| 7,453,107 B1 | 11/2008 | Kapoor | |
| 7,465,997 B2 | 12/2008 | Kinzer et al. | |
| 7,477,082 B2 | 1/2009 | Fukazawa | |
| 7,482,788 B2 | 1/2009 | Yang | |
| 7,501,669 B2 | 3/2009 | Parikh et al. | |
| 7,522,435 B2 | 4/2009 | Kohnotoh et al. | |
| 7,538,366 B2 | 5/2009 | Saito et al. | |
| 7,547,964 B2 | 6/2009 | Pavier et al. | |
| 7,548,112 B2 | 6/2009 | Sheppard | |
| 7,550,781 B2 | 6/2009 | Kinzer et al. | |
| 7,612,602 B2 | 11/2009 | Yang et al. | |
| 7,639,064 B2 | 12/2009 | Hsiao et al. | |
| 7,701,009 B2 | 4/2010 | Koyama | |
| 7,714,360 B2 | 5/2010 | Otsuka et al. | |
| 7,719,055 B1 | 5/2010 | McNutt et al. | |
| 7,745,930 B2 | 6/2010 | Connah et al. | |
| 7,746,020 B2 | 6/2010 | Schnetzka et al. | |
| 7,755,108 B2 | 7/2010 | Kuraguchi | |
| 7,782,099 B2 | 8/2010 | Kawamura | |
| 7,795,642 B2 | 9/2010 | Suh et al. | |
| 7,800,215 B2 | 9/2010 | Satou et al. | |
| 7,804,328 B2 | 9/2010 | Pentakota et al. | |
| 7,811,872 B2 | 10/2010 | Hoshi et al. | |
| 7,825,435 B2 | 11/2010 | Machida et al. | |
| 7,851,825 B2 | 12/2010 | Suh et al. | |
| 7,851,909 B2 | 12/2010 | Mishra et al. | |
| 7,852,137 B2 | 12/2010 | Machida et al. | |
| 7,855,401 B2 | 12/2010 | Sheppard et al. | |
| 7,863,877 B2 | 1/2011 | Briere | |
| 7,875,907 B2 | 1/2011 | Honea et al. | |
| 7,875,914 B2 | 1/2011 | Sheppard | |
| 7,884,394 B2 | 2/2011 | Wu et al. | |
| 7,884,395 B2 | 2/2011 | Saito | |
| 7,893,676 B2 | 2/2011 | Hanna | |
| 7,893,791 B2 | 2/2011 | Ma et al. | |
| 7,898,004 B2 | 3/2011 | Wu et al. | |
| 7,898,509 B2 | 3/2011 | Iida et al. | |
| 7,902,809 B2 | 3/2011 | Briere et al. | |
| 7,906,837 B2 | 3/2011 | Cabahug et al. | |
| 7,915,643 B2 | 3/2011 | Suh et al. | |
| 7,920,013 B2 | 4/2011 | Sachdev et al. | |
| 7,932,539 B2 | 4/2011 | Chen et al. | |
| 7,939,391 B2 | 5/2011 | Suh et al. | |
| 7,965,126 B2 | 6/2011 | Honea et al. | |
| 7,973,335 B2 | 7/2011 | Okamoto et al. | |
| 7,982,242 B2 | 7/2011 | Goto | |
| 8,013,580 B2 | 9/2011 | Cervera et al. | |
| 8,018,056 B2 | 9/2011 | Hauenstein | |
| 8,054,110 B2 | 11/2011 | Wang et al. | |
| 8,063,616 B2 | 11/2011 | Bahramian et al. | |
| 8,084,783 B2 | 12/2011 | Zhang | |
| 8,089,139 B2 | 1/2012 | Shi et al. | |
| 8,114,710 B2 | 2/2012 | Muto et al. | |
| 8,138,529 B2 | 3/2012 | Wu | |
| 8,188,596 B2 | 5/2012 | Otremba | |
| 8,193,559 B2 | 6/2012 | Haeberlen et al. | |
| 8,193,562 B2 | 6/2012 | Suh et al. | |
| 8,237,198 B2 | 8/2012 | Wu et al. | |
| 8,258,622 B2 | 9/2012 | Lee et al. | |
| 8,264,003 B2 | 9/2012 | Herman | |
| 8,289,065 B2 | 10/2012 | Honea et al. | |
| 8,344,424 B2 | 1/2013 | Suh et al. | |
| 8,363,437 B2 | 1/2013 | Wang et al. | |
| 8,384,243 B2 | 2/2013 | Adest et al. | |
| 8,389,977 B2 | 3/2013 | Chu et al. | |
| 8,390,000 B2 | 3/2013 | Chu et al. | |
| 8,431,965 B2 | 4/2013 | Takemae | |
| 8,441,128 B2 | 5/2013 | Domes | |
| 8,455,931 B2 | 6/2013 | Wu | |
| 8,493,129 B2 | 7/2013 | Honea et al. | |
| 8,508,281 B2 | 8/2013 | Honea et al. | |
| 8,519,438 B2 | 8/2013 | Mishra et al. | |
| 8,530,904 B2 | 9/2013 | Treu et al. | |
| 8,530,996 B2 | 9/2013 | Shono | |
| 8,531,232 B2 | 9/2013 | Honea et al. | |
| 8,536,622 B2 | 9/2013 | Takemae et al. | |
| 8,541,815 B2 | 9/2013 | Takemae et al. | |
| 8,541,818 B2 | 9/2013 | Wu et al. | |
| 8,569,124 B2 | 10/2013 | Akiyama et al. | |
| 8,581,300 B2 | 11/2013 | Yamada | |
| 8,592,974 B2 | 11/2013 | Wu | |
| 8,598,937 B2 | 12/2013 | Lal et al. | |
| 8,603,880 B2 | 12/2013 | Yamada | |
| 8,624,662 B2 | 1/2014 | Parikh et al. | |
| 8,633,517 B2 | 1/2014 | Kamada | |
| 8,633,518 B2 | 1/2014 | Suh et al. | |
| 8,643,062 B2 | 2/2014 | Parikh et al. | |
| 8,648,643 B2 | 2/2014 | Wu | |
| 8,664,927 B2 | 3/2014 | Shono | |
| 8,675,326 B2 | 3/2014 | Shono | |
| 8,681,518 B2 | 3/2014 | Callanan et al. | |
| 8,692,294 B2 | 4/2014 | Chu et al. | |
| 8,716,141 B2 | 5/2014 | Dora et al. | |
| 8,742,459 B2 | 6/2014 | Mishra et al. | |
| 8,742,460 B2 | 6/2014 | Mishra et al. | |
| 8,766,711 B2 | 7/2014 | Takemae | |
| 8,772,842 B2 | 7/2014 | Dora | |
| 8,773,176 B2 | 7/2014 | Miyazaki et al. | |
| 8,786,327 B2 * | 7/2014 | Honea .................. | H02M 1/126 327/110 |
| 8,803,246 B2 | 8/2014 | Wu et al. | |
| 8,816,497 B2 | 8/2014 | Wu | |
| 8,816,751 B2 | 8/2014 | Honea et al. | |
| 8,836,301 B2 | 9/2014 | Shono | |
| 8,836,308 B2 | 9/2014 | Shono | |
| 8,836,380 B2 | 9/2014 | Takemae | |
| 8,841,702 B2 | 9/2014 | Mishra et al. | |
| 8,847,283 B2 | 9/2014 | Kamada et al. | |
| 8,860,495 B2 | 10/2014 | Lal et al. | |
| 8,878,248 B2 | 11/2014 | Ishiguro et al. | |
| 8,878,571 B2 | 11/2014 | Takemae | |
| 8,883,581 B2 | 11/2014 | Ohki | |
| 8,890,206 B2 | 11/2014 | Yamada | |
| 8,890,314 B2 | 11/2014 | Wu | |
| 8,895,421 B2 | 11/2014 | Parikh et al. | |
| 8,895,423 B2 | 11/2014 | Dora | |
| 8,901,604 B2 | 12/2014 | Mishra et al. | |
| 8,912,839 B2 | 12/2014 | Honea et al. | |

(56) References Cited

U.S. PATENT DOCUMENTS

| | | | |
|---|---|---|---|
| 8,933,489 B2 | 1/2015 | Kikkawa | |
| 8,952,750 B2 | 2/2015 | Wu | |
| 8,957,453 B2 | 2/2015 | Yamada et al. | |
| 8,962,409 B2 | 2/2015 | Tomabechi | |
| 9,006,787 B2 | 4/2015 | Yamada | |
| 9,035,356 B2 | 5/2015 | Yamada | |
| 9,041,065 B2 | 5/2015 | Wu et al. | |
| 9,041,435 B2 | 5/2015 | Honea et al. | |
| 9,059,076 B2* | 6/2015 | Wu | H01L 21/28264 |
| 9,059,136 B2 | 6/2015 | Kamada et al. | |
| 9,087,718 B2 | 7/2015 | Lal | |
| 9,093,366 B2 | 7/2015 | Mishra et al. | |
| 2004/0120090 A1* | 6/2004 | Galli | H02M 3/3376 361/115 |
| 2006/0175627 A1 | 8/2006 | Shiraishi | |
| 2007/0164428 A1 | 7/2007 | Elbanhawy et al. | |
| 2007/0210329 A1 | 9/2007 | Goto | |
| 2008/0017998 A1 | 1/2008 | Pavio | |
| 2008/0231211 A1 | 9/2008 | Baarman et al. | |
| 2008/0248634 A1 | 10/2008 | Beach | |
| 2009/0050936 A1 | 2/2009 | Oka | |
| 2009/0072269 A1 | 3/2009 | Suh et al. | |
| 2009/0085219 A1 | 4/2009 | Bayerer | |
| 2009/0278513 A1 | 11/2009 | Bahramian et al. | |
| 2010/0079192 A1 | 4/2010 | Strzalkowski | |
| 2010/0328833 A1 | 12/2010 | Frisch et al. | |
| 2011/0169549 A1 | 7/2011 | Wu | |
| 2011/0298383 A1 | 12/2011 | Muehlschlegel | |
| 2012/0306464 A1 | 12/2012 | Hirler et al. | |
| 2013/0033240 A1 | 2/2013 | Ye | |
| 2013/0222045 A1 | 8/2013 | Wu | |
| 2016/0006428 A1* | 1/2016 | Wang | H03K 17/16 327/109 |

FOREIGN PATENT DOCUMENTS

| | | |
|---|---|---|
| CN | 101978589 | 2/2011 |
| CN | 102165694 | 8/2011 |
| CN | 102308387 | 1/2012 |
| CN | 103477543 | 12/2013 |
| EP | 2 188 842 | 5/2010 |
| EP | 2 243 213 | 10/2010 |
| EP | 2 394 303 | 12/2011 |
| JP | 5-075040 | 3/1993 |
| JP | 6-067744 | 3/1994 |
| JP | 2000-101356 | 4/2000 |
| JP | 2000-124358 | 4/2000 |
| JP | 2003-243612 | 8/2003 |
| JP | 2003-244943 | 8/2003 |
| JP | 2003-338742 | 11/2003 |
| JP | 2004-281454 | 10/2004 |
| JP | 2006-033723 | 2/2006 |
| JP | 2006-173754 | 6/2006 |
| JP | 2006-223016 | 8/2006 |
| JP | 2007-036218 | 2/2007 |
| JP | 2007-215331 | 8/2007 |
| JP | 2007-252055 | 9/2007 |
| JP | 2007-294769 | 11/2007 |
| JP | 2008-187167 | 8/2008 |
| JP | 2008-198735 | 8/2008 |
| JP | 2008-199771 | 8/2008 |
| JP | 2009-218475 | 9/2009 |
| JP | 2010-539712 | 12/2010 |
| JP | 2011-512119 | 4/2011 |
| JP | 2012-517699 | 8/2012 |
| KR | 10-1998-0021826 | 6/1998 |
| TW | 200941920 | 10/2009 |
| TW | 201027912 | 7/2010 |
| TW | 201036155 | 10/2010 |
| TW | 201126686 | 8/2011 |
| TW | 201143017 | 12/2011 |
| TW | 201332085 | 8/2013 |
| TW | 201347143 | 11/2013 |
| WO | WO 2009/036181 | 3/2009 |
| WO | WO 2009/036266 | 3/2009 |
| WO | WO 2009/102732 | 8/2009 |
| WO | WO 2010/039463 | 4/2010 |
| WO | WO 2010/090885 | 8/2010 |
| WO | WO 2011/053981 | 5/2011 |
| WO | WO 2011/085260 | 7/2011 |
| WO | WO 2011/097302 | 8/2011 |
| WO | WO 2013/085839 | 6/2013 |

OTHER PUBLICATIONS

U.S. Appl. No. 14/108,642, filed Dec. 17, 2013, Gallium Nitride Power Devices.
U.S. Appl. No. 60/971,721, filed Sep. 12, 2007, III-Nitride Bilateral Switches.
U.S. Appl. No. 60/972,467, filed Sep. 14, 2007, Growing N-Polar III-Nitride Structures.
U.S. Appl. No. 12/209,504, filed Sep. 12, 2008, Growing N-Polar III-Nitride Structures.
U.S. Appl. No. 60/972,481, filed Sep. 14, 2007, III-Nitride Devices with Recessed Gates.
U.S. Appl. No. 61/012,755, filed Dec. 10, 2007, Insulated Gate E-Mode Transistors.
U.S. Appl. No. 61/028,133, filed Feb. 12, 2008, Bridge Circuits and their Components.
U.S. Appl. No. 14/539,098, filed Nov. 12, 2014, Bridge Circuits and their Components.
U.S. Appl. No. 14/464,639, filed Aug. 20, 2014, Enhancement Mode III-N HEMTs.
U.S. Appl. No. 61/099,451, filed Sep. 23, 2008, Inductive Load Power Switching Circuits.
U.S. Appl. No. 14/332,967, filed Jul. 16, 2014, Inductive Load Power Switching Circuits.
U.S. Appl. No. 14/480,980, filed Sep. 9, 2014, Package Configurations for Low EMI Circuits.
U.S. Appl. No. 13/756,284, filed Jan. 31, 2013, Methods of Forming Reverse Side Engineered III-Nitride Devices.
U.S. Appl. No. 14/262,649, filed Apr. 25, 2014, High Voltage III-Nitride Semiconductor Devices.
U.S. Appl. No. 14/178,701, filed Feb. 12, 2014, Semiconductor Devices with Field Plates.
U.S. Appl. No. 14/660,080, filed Mar. 17, 2015, Semiconductor Devices with Field Plates.
U.S. Appl. No. 14/336,287, filed Jul. 21, 2014, Electronic Devices and Components for High Efficiency Power Circuits.
U.S. Appl. No. 14/058,089, filed Oct. 18, 2013, Semiconductor Electronic Components and Circuits.
U.S. Appl. No. 14/260,808, filed Apr. 24, 2014, Transistors with Isolated Regions.
U.S. Appl. No. 12/953,769, filed Nov. 24, 2010, Layer Structures for Controlling Stress of Heteroepitaxially Grown III-Nitride Layers.
U.S. Appl. No. 14/530,204, filed Oct. 31, 2014, Semiconductor Devices with Guard Rings.
U.S. Appl. No. 14/522,154, filed Oct. 23, 2014, III-N Device Structures and Methods.
U.S. Appl. No. 14/524,299, filed Oct. 27, 2014, Semiconductor Diodes with Low Reverse Bias Currents.
U.S. Appl. No. 14/211,104, filed Mar. 14, 2014, Electrode Configurations for Semiconductor Devices.
U.S. Appl. No. 61/447,519, filed Feb. 28, 2011, Electronic Components with Reactive Filters.
U.S. Appl. No. 61/568,022, filed Dec. 7, 2011, Semiconductor Modules and Methods of Forming the Same.
U.S. Appl. No. 13/690,103, filed Nov. 30, 2012, Semiconductor Modules and Methods of Forming the Same.
U.S. Appl. No. 13/366,090, filed Feb. 3, 2012, Buffer Layer Structures Suited for III-Nitride Devices with Foreign Substrates.
U.S. Appl. No. 14/585,705, filed Dec. 30, 2014, Semiconductor Power Modules and Devices.
U.S. Appl. No. 61/621,956, filed Apr. 9, 2012, N-Polar III-Nitride Transistors.
U.S. Appl. No. 14/744,526, filed Jun. 19, 2015, N-Polar III-Nitride Transistors.

(56) References Cited

OTHER PUBLICATIONS

U.S. Appl. No. 61/765,635, filed Feb. 15, 2013, Electrodes for Semiconductor Devices and Methods of Forming the Same.
U.S. Appl. No. 14/179,788, filed Feb. 13, 2014, Electrodes for Semiconductor Devices and Methods of Forming the Same.
U.S. Appl. No. 61/791,395, filed Mar. 15, 2013, Carbon Doping Semiconductor Devices.
U.S. Appl. No. 14/208,304, filed Mar. 13, 2014, Carbon Doping Semiconductor Devices.
U.S. Appl. No. 14/714,964, filed May 18, 2015, Enhancement-Mode III-Nitride Devices.
U.S. Appl. No. 61/807,258, filed Apr. 1, 2013, Gate Drivers for Circuits Based on Semiconductor Devices.
U.S. Appl. No. 14/708,627, filed May 11, 2015, Gate Drivers for Circuits Based on Semiconductor Devices.
U.S. Appl. No. 61/844,260, filed Jul. 9, 2013, Multilevel Inverters and their Components.
U.S. Appl. No. 14/321,269, filed Jul. 1, 2014, Multilevel Inverters and their Components.
U.S. Appl. No. 61/856,573, filed Jul. 19, 2013, III-Nitride Transistor Including a P-Type Depleting Layer.
U.S. Appl. No. 14/327,371, filed Jul. 9, 2014, III-Nitride Transistor Including a P-Type Depleting Layer.
U.S. Appl. No. 14/208,482, filed Mar. 13, 2014, Carbon Doping Semiconductor Devices.
U.S. Appl. No. 62/025,666, filed Jul. 17, 2014, Bridgeless Power Factor Correction Circuits.
U.S. Appl. No. 62/133,253, filed Mar. 13, 2015, Paralleling of Switching Devices for High Power Circuits.
U.S. Appl. No. 13/231,308, filed Sep. 13, 2011, III-N Device Structures Having a Non-Insulating Substrate.
U.S. Appl. No. 14/478,504, filed Sep. 5, 2014, Method of Forming Electronic Components with Increased Reliability.
U.S. Appl. No. 13/535,094, filed Jun. 27, 2012, Semiconductor Devices with Integrated Hole Collectors.
U.S. Appl. No. 14/311,600, filed Jun. 23, 2014, Semiconductor Electronic Components with Integrated Current Limiters.
U.S. Appl. No. 13/551,094, filed Jul. 17, 2012, Contacts for Semiconductor Devices and Methods of Forming the Same.
U.S. Appl. No. 61/672,723, filed Jul. 17, 2012, Devices and Components for Power Conversion Circuits.
U.S. Appl. No. 13/803,912, filed Mar. 14, 2013, Devices and Components for Power Conversion Circuits.
U.S. Appl. No. 14/323,777, filed Jul. 3, 2014, Switching Circuits Having Ferrite Beads.
U.S. Appl. No. 62/027,126, filed Jul. 21, 2014, Forming Enhancement Mode III-Nitride Devices.
U.S. Appl. No. 14/542,937, filed Nov. 17, 2014, Forming Enhancement Mode III-Nitride Devices.
U.S. Appl. No. 14/572,670, filed Dec. 16, 2014, Recessed Ohmic Contacts in a III-N Device.
U.S. Appl. No. 62/092,732, filed Dec. 16, 2014, Gate Structures for III-N Devices.
U.S. Appl. No. 14/034,043, filed Sep. 23, 2013, Compound Semiconductor Device and Method of Manufacturing Same.
U.S. Appl. No. 13/865,448, filed Apr. 18, 2013, Semiconductor Device Including Embedded Portions in Compund Semiconductor Films.
U.S. Appl. No. 14/645,317, filed Mar. 11, 2015, Semiconductor Device Including Gate Electrode Provided over Active Region in P-type Nitride Semiconductor Layer and Method of Manufacturing the Same, and Power Supply Apparatus.
U.S. Appl. No. 13/361,216, filed Jan. 30, 2012, Switching Circuit Device and Power Supply Device Having Same.
U.S. Appl. No. 13/532,963, filed Jun. 26, 2012, Semiconductor Device Comprising a Protective Diode.
U.S. Appl. No. 13/553,280, filed Jul. 19, 2012, Drive Circuit of Power Unit, and Power Unit.
U.S. Appl. No. 13/557,322, filed Jul. 25, 2012, Compund Semiconductor Device and Method for Manufacturing the Same.
U.S. Appl. No. 13/597,564, filed Aug. 29, 2012, Semiconductor Device and Method of Manufacturing the Same.
U.S. Appl. No. 13/551,769, filed Jul. 18, 2012, Compound Semiconductor Device and Method for Fabricating the Same.
U.S. Appl. No. 13/586,078, filed Aug. 15, 2012, Compound Semiconductor Device and Method of Manufacturing the Same.
U.S. Appl. No. 13/572,806, filed Aug. 13, 2012, Semiconductor Device.
U.S. Appl. No. 13/602,509, filed Sep. 4, 2012, Semiconductor Device and Method of Manufacturing the Same.
U.S. Appl. No. 13/731,759, filed Dec. 31, 2012, Compound Semiconductor Device and Method of Manufacturing the Same.
U.S. Appl. No. 13/723,527, filed Dec. 21, 2012, Compound Semiconductor Device and Method of Manufacturing the Same.
U.S. Appl. No. 14/561,450, filed Dec. 5, 2014, Compound Semiconductor Device and Manufacturing Method of the Same.
U.S. Appl. No. 13/758,078, filed Feb. 4, 2013, Semiconductor Device.
U.S. Appl. No. 13/724,903, filed Dec. 21, 2012, Compound Semiconductor Device and Method of Manufacturing the Same.
U.S. Appl. No. 13/720,349, filed Dec. 19, 2012, Compound Semiconductor Device and Method for Manufacturing the Same.
U.S. Appl. No. 13/942,773, filed Jul. 16, 2013, Compound Semiconductor Device and Method for Manufacturing the Same.
U.S. Appl. No. 14/066,025, filed Oct. 29, 2013, Compound Semiconductor Device and Method of Manufacturing the Same.
U.S. Appl. No. 14/062,716, filed Oct. 24, 2013, Control Device and Power Supply Device.
U.S. Appl. No. 13/956,867, filed Aug. 1, 2013, Compound Semiconductor Device and Method of Manufacturing the Same.
U.S. Appl. No. 14/096,344, filed Dec. 4, 2013, Semiconductor Device and Method for Fabricating the Same.
U.S. Appl. No. 13/943,874, filed Jul. 17, 2013, Semiconductor Device and Manufacturing Method of Semiconductor Device.
U.S. Appl. No. 14/057,839, filed Oct. 18, 2013, Power Supply Device.
U.S. Appl. No. 14/582,583, filed Dec. 24, 2014, Semiconductor Device and Method of Manufacturing a Semiconductor Device.
U.S. Appl. No. 14/639,977, filed Mar. 5, 2015, Semiconductor Device and Manufacturing Method of Semiconductor Device.
U.S. Appl. No. 13/968,843, filed Aug. 16, 2013, Semiconductor Device and Method for Manufacturing a Semiconductor Device.
U.S. Appl. No. 14/030,172, filed Sep. 18, 2013, Compound Semiconductor Device and Method of Manufacturing the Same..
U.S. Appl. No. 14/010,824, filed Aug. 27, 2013, Compund Semiconductor Device and Method of Manufacturing the Same.
U.S. Appl. No. 13/975,713, filed Aug. 26, 2013, Compund Semiconductor Device and Method of Manufacturing the Same.
U.S. Appl. No. 14/010,836, filed Aug. 27, 2013, Compund Semiconductor Device and Method of Manufacturing the Same.
U.S. Appl. No. 14/032,493, filed Sep. 20, 2013, Compund Semiconductor Device and Method of Manufacturing the Same.
U.S. Appl. No. 14/098,853, filed Dec. 6, 2013, Semiconductor Device and Method for Manufacturing Semiconductor Device.
U.S. Appl. No. 14/167,843, filed Jan. 29, 2014, Semiconductor Apparatus.
U.S. Appl. No. 14/139,050, filed Dec. 23, 2013, Semiconductor Device and Method for Manufacturing Semiconductor Device.
Authorized officer Keon Hyeong Kim, International Search Report and Written Opinion in PCT/US2008/076160 mailed Mar. 18, 2009, 11 pages.
Authorized officer Simin Baharlou, International Preliminary Report on Patentability in PCT/US2008/076160, mailed Mar. 25, 2010, 6 pages.
Authorized officer Jae Woo Wee, International Search Report and Written Opinion in PCT/US2009/033699, mailed Sep. 21, 2009, 11 pages.
Authorized officer Dorothée Mülhausen, International Preliminary Report on Patentability in PCT/US2009/033699, mailed Aug. 26, 2010, 6 pages.
Authorized officer Sung Hee Kim, International Search Report and the Written Opinion in PCT/US2009/057554, mailed May 10, 2010, 13 pages.

(56) References Cited

OTHER PUBLICATIONS

Authorized Officer Gijsbertus Beijer, International Preliminary Report on Patentability in PCT/US2009/057554, mailed Mar. 29, 2011, 7 pages.
Authorized officer Sung Chan Chung, International Search Report and Written Opinion for PCT/US2010/021824, mailed Aug. 23, 2010, 9 pages.
Authorized officer Beate Giffo-Schmitt, International Preliminary Report on Patentability in PCT/US2010/021824, mailed Aug. 18, 2011, 6 pages.
Authorized officer Bon Gyoung Goo, International Search Report and Written Opinion in PCT/US2010/055129, mailed Jul. 1, 2011, 11 pages.
Authorized officer Yolaine Cussac, International Preliminary Report on Patentability in PCT/US2010/055129, mailed May 18, 2012, 6 pages.
Authorized officer Sung Joon Lee, International Search Report and Written Opinion in PCT/US2011/020592, mailed Sep. 19, 2011, 9 pages.
Authorized officer Philippe Bécamel, International Preliminary Report on Patentability in PCT/US2011/020592, mailed Jul. 19, 2012, 7 pages.
Authorized officer Kee Young Park, International Search Report and Written Opinion in PCT/US2011/023485, mailed Sep. 23, 2011, 10 pages.
Authorized officer Nora Lindner, International Preliminary Report on Patentability in PCT/US2011/023485, mailed Aug. 16, 2012, 7 pages.
Authorized officer Kwak In Gu, International Search Report and Written Opinion in PCT/US2012/026810, mailed Jan. 23, 2013, 10 pages.
Authorized officer Lingfei Bai, International Preliminary Report on Patentability in PCT/US2012/026810, mailed Sep. 12, 2013, 6 pages.
Authorized officer Sang Won Choi, International Search Report and Written Opinion in PCT/US2013/027294, mailed Jun. 26, 2013, 10 pages.
Authorized officer Kihwan Moon, International Preliminary Report on Patentability in PCT/US2013/027294, mailed Sep. 4, 2014, 7 pages.
Authorized officer Sung Gon Kim, International Search Report and Written Opinion in PCT/US2014/032241, mailed Aug. 11, 2014, 12 pages.
Authorized officer Hye Lyun Park, International Search Report and Written Opinion in PCT/US2014/045137, mailed Oct. 16, 2014, 9 pages.
Search Report and Action in TW Application No. 098132132, issued Dec. 6, 2012, 8 pages.
Search Report and Action in TW Application No. 098141930, issued Jul. 10, 2014, 7 pages.
Chinese Third Office Action in Application No. 200980110230.0, Jan. 24, 2014, 18 pages.
Japanese Office Action in Application No. 2010-546867, Sep. 24, 2013, 14 pages.
Chen et al., "Single-Chip Boost Converter Using Monolithically Integrated AlGan/GaN Lateral Field-Effect Rectifier and Normally Off HEMT," IEEE Electron Device Letters, May 2009, 30(5):430-432.
Choi et al., "AN-9005 Driving and Layout Design for Fast Switching Super-junction MOSFETs," © 2013 Fairchild Corporation, 13 pages.
Huselstein et al., "Use of the MOSFET Channel Reverse Conduction in an Inverter for Suppression of the Integral Diode Recovery Current," 1993, The European Power Electronics Association, pp. 431-436.
Napierala et al., "Selective GaN Epitaxy on Si(111) Substrates Using Porous Aluminum Oxide Buffer Layers," Journal of the Electrochemical Society, 2006. 153(2):G125-G127, 4 pages.
Rodríguez et al, "Tutorial on Multilevel Converters," International Conference on Power Electronics and Intelligent Control for Energy Conservation, Warsaw, Poland, Oct. 17-19, 2005, 148 pages.
Wu et al., "A 97.8% Efficient GaN HEMT Boost Converter with 300-W Output Power at 1 MHz," Electronic Device Letters, 2008, IEEE, 29(8):824-826.
Jenkins et al., "The Impact of Parallel GaN HEMTs on Efficiency of a 12-to-1 V Buck Converter," Workshop on Wide Bandgap Power Devices and Applications (WiPDA), 2013 IEEE, pp. 197-200.
Liu et al., Design of a 2 MW DC Supply Using a 4-stage Interleaved DC-DC Converter, In Proc. Energy Conversion Congress and Exposition (ECCE), Sep. 2014 IEEE, pp. 964-970.
Liu et al., "Design and Evaluation of GaN-based Dual-phase Interleaved MHz Critical Mode PFC Converter," In Proc. Energy Conversion Congress and Exposition (ECCE), Sep. 2014 IEEE, pp. 611-616.
Liu et al., "Topology, Cost and Efficiency Comparisons of a 2 MW DC Supply Using Interleaved DC-DC Converter," In Proc. IEEE International Symposium on Power Electronics for Distributed Generation Systems (PEDG), Jun. 2014, 6 pages.
Reusch and Strydom, "Improving Performance of High Speed GaN Transistors Operating in Parallel for High Current Applications," PCIM Europe May 20-22, 2014; In Proc. International Exhibition and Conference for Power Electronics, Intelligent Motion, Renewable Energy and Energy Management; pp. 302-309.
Silicon Labs, Datasheet of Si823x (2015) [online]; available at www.silabs.com, 57 pages.
Waffler and Kolar, "Efficiency Optimization of an Automotive Multi-phase Bi-directional DC-DC Converter," In Proc. 6th International Power Electronics and Motion Control Conference IPEMC '09, May 17-20, 2009, pp. 566-572.
Wang et al., "Investigation of Driver Circuits for GaN HEMTs in Leaded Packages," Workshop on Wide Bandgap Power Devices and Applications (WiPDA), 2014 IEEE, pp. 81-87.
Wu, "Paralleling High-speed GaN Power HEMTs for Quadrupled Power Output," Applied Power Electronics Conference and Exposition (APEC), 2013, pp. 211-214.
Wu et al., "High-frequency, GaN Diode-free Motor Drive Inverter with Pure Sine Wave Output," PCIM Europe 2012, Conference Digest, pp. 40-43.
Wu et al., "Total GaN Solution to Electrical Power Conversion," the 69th IEEE Device Research Conference, Conference Digest, Jun. 20-22, 2011, pp. 217-218.
Xu et al., "Investigation of 600 V GaN HEMTs for High Efficiency and High Temperature Applications," Applied Power Electronics Conference and Exposition (APEC), Apr. 2014, pp. 131-136.
Zhang et al., "Common-mode Circulating Current Control of Paralleled Interleaved Three-phase Two-level Voltage-source Converters with Discontinuous Space-vector Modulation," IEEE Transactions on Power Electronics, Dec. 2011, 26(12):3925-3935.
Zhang et al., "Evaluation of 600 V Cascode GaN HEMT in Device Characterization and All-GaN-based LLC Resonant Converter," In Proc. Energy Conversion Congress and Exposition (ECCE), Sep. 2013 IEEE, pp. 3571-3578.
Zhang et al., "Gate Drive Design Considerations for High Voltage Cascode GaN HEMT," Applied Power Electronics Conference and Exposition (APEC), Mar. 2014, pp. 1484-1489.
Zhang et al., "Impact of Interleaving on AC Passive Components of Paralleled Three-phase Voltage-source Converters," IEEE Transactions on Industry Applications, May/Jun. 2010, 46(3):1042-1054.
Zhou and Wu, "99% Efficiency True-bridgeless Totem-pole PFC Based on GaN HEMTs," PCIM Europe May 14-16, 2013, pp. 1017-1022.

* cited by examiner

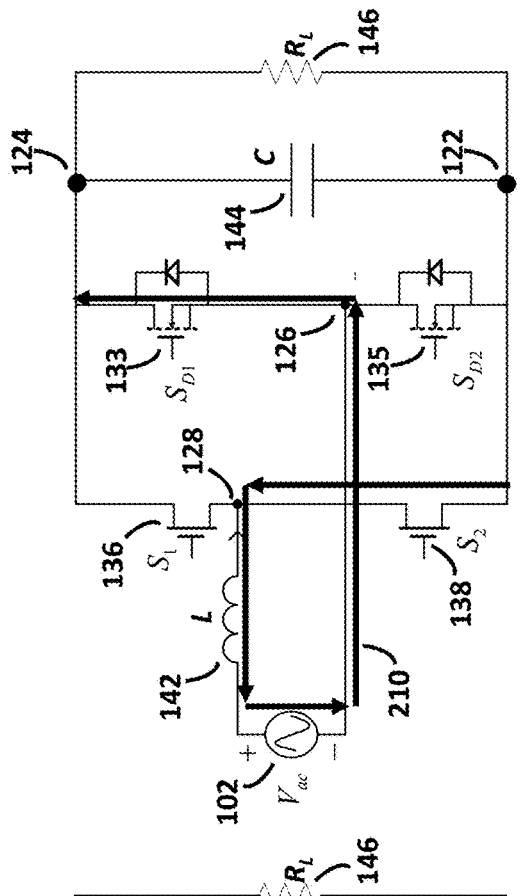
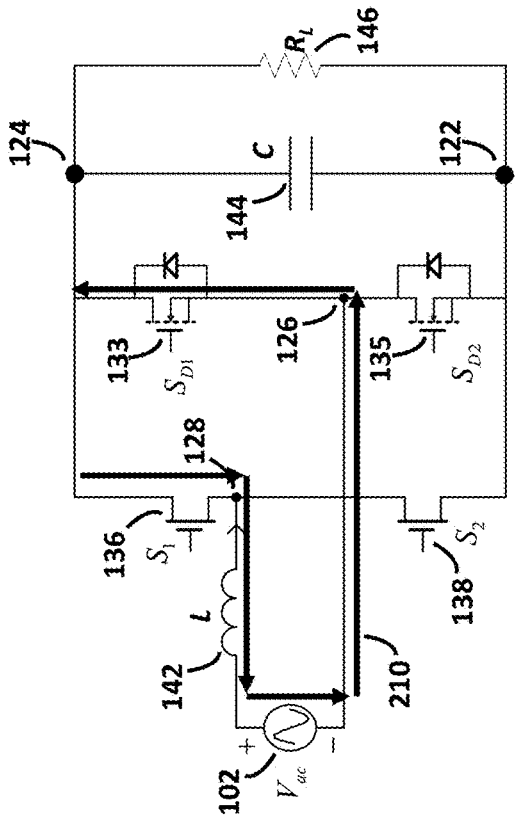

BRIDGELESS POWER FACTOR CORRECTION CIRCUITS

CROSS-REFERENCE TO RELATED APPLICATION

This application claims priority to U.S. Provisional Application No. 62/025,666, filed on Jul. 17, 2014. The disclosure of the prior application is considered part of and is incorporated by reference in the disclosure of this application.

TECHNICAL FIELD

This invention relates to power conversion circuits such as power factor correction circuits.

BACKGROUND

Power factor correction (PFC) circuits have been widely adopted for performing AC-DC power conversion. Conventional PFC converters comprise a full-wave diode bridge rectifier connected to a boost circuit. Along the power delivery path (i.e., the path of current flow) from the AC power supply to the DC power supply, the current passes through two diodes while flowing through the bridge rectifier at the input stage and through another in the boost stage. Power loss associated with the diode voltage drop and current flowing through the diode is incurred for each of these three diodes, which sets a hard limit on the overall system efficiency.

SUMMARY

In a first aspect, an electronic circuit comprises a first III-N based switch and a second III-N based switch, where a source of the first III-N based switch is coupled to a first reference ground and a drain of the second III-N based switch is coupled to a DC high voltage node. The electronic circuit also includes an inductive component connected in series with a resistor and coupled to a node between the first and second III-N based switches. A first side of the resistor is coupled to a second reference ground which is electrically isolated from the first reference ground, and a second side of the resistor is coupled to a control circuit, wherein the control circuit is also coupled to the second reference ground.

In a second aspect, a method of sensing current in a power factor correction circuit includes a power factor correction circuit comprising a first III-N based switch and a second III-N based switch, wherein a source of the first III-N based switch is coupled to a first reference ground and a drain of the second III-N based switch is coupled to a DC high voltage node. The power factor correction circuit also includes an inductive component connected in series with a resistor and coupled to a node between the first and second III-N based switches. A first side of the resistor is coupled to a second reference ground which is electrically isolated from the first reference ground, and a second side of the resistor is coupled to a control circuit, the control circuit including an amplifier which is also coupled to the second reference ground and has a bandwidth that is greater than a switching frequency of each of the first and second III-N based switches. The method comprises amplifying a voltage across the resistor and having the control circuit measure the voltage across the resistor.

In a third aspect, an electronic circuit comprises a first III-N based switch and a second III-N based switch, where a source of the first III-N based switch is coupled to a first reference ground and a drain of the second III-N based switch is coupled to a DC high voltage node. The electronic circuit also includes a third III-N based switch and a fourth III-N based switch, where a source of the third III-N based switch is coupled to the first reference ground and a drain of the fourth III-N based switch is coupled to the DC high voltage node. The electronic circuit further includes a first inductive component connected in series with a first resistor and coupled to a node between the first and second III-N based switches, and a second inductive component connected in series with a second resistor and coupled to a node between the third and fourth III-N based switches. A first side of the first resistor and a first side of the second resistor are each coupled to a second reference ground which is electrically isolated from the first reference ground, and a second side of the first resistor and a second side of the second resistor are each coupled to a control circuit, wherein the control circuit is also coupled to the second reference ground.

Implementations of the devices and methods described herein may include one or more of the following features. The electronic circuit may be a power factor correction circuit. The control circuit can be configured to measure current flowing through the inductive component during operation of the electronic circuit. The control circuit can also be configured to measure voltage at the second side of the resistor relative to the second reference ground. The circuit may further include a printed circuit board with a first metal layer between a second metal layer and a third metal layer, wherein a trench is formed in the first metal layer, the trench separating the first metal layer into first and second portions which are electrically isolated from one another. The first portion of the first metal layer may serve as a ground plane for the first reference ground, and the second portion of the first metal layer may serve as a ground plane for the second reference ground.

The electronic circuit may be a power factor correction circuit. The control circuit can be configured to measure current flowing through the inductive component during operation of the electronic circuit. The control circuit can also be configured to measure voltage at the second side of the resistor relative to the second reference ground. The circuit may further include a printed circuit board with a first metal layer between a second metal layer and a third metal layer, wherein a trench is formed in the first metal layer, the trench separating the first metal layer into first and second portions which are electrically isolated from one another. The first portion of the first metal layer may serve as a ground plane for the first reference ground, and the second portion of the first metal layer may serve as a ground plane for the second reference ground.

The resistance of the resistor may be less than 50 milliohms. Furthermore, the first and second III-N based switches can each be configured to be switched at a frequency of at least 50 kHz. The control circuit may also include an amplifier powered by a voltage supply which is coupled to the second reference ground. The amplifier may have a bandwidth that is greater than a switching frequency of each of the first and second III-N based switches.

As used herein, two or more contacts or other items such as conductive channels or components are said to be "electrically connected" if they are connected by a material which is sufficiently conducting to ensure that the electric potential at each of the contacts or other items is intended to be the same, e.g., is about the same, at all times under any bias conditions.

As used herein, "blocking a voltage" refers to the ability of a transistor, device, or component to prevent significant current, such as current that is greater than 0.001 times the operating current during regular conduction, from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the operating current during regular conduction. Devices with off-state currents which are larger than this value exhibit high loss and low efficiency, and are typically not suitable for many applications.

As used herein, a "high-voltage device", e.g., a high-voltage switching transistor, is an electronic device which is optimized for high-voltage switching applications. That is, when the transistor is off, it is capable of blocking high voltages, such as about 300V or higher, about 600V or higher, or about 1200V or higher, and when the transistor is on, it has a sufficiently low on-resistance ($R_{ON}$) for the application in which it is used, e.g., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300V, 600V, 1200V, or other suitable blocking voltage required by the application. In other words, a high-voltage device can block all voltages between 0V and at least $V_{max}$, where $V_{max}$ is the maximum voltage that can be supplied by the circuit or power supply, and $V_{max}$ can for example be 300V, 600V, 1200V, or other suitable blocking voltage required by the application.

As used herein, a "III-Nitride" or "III-N device" is a device based on III-N materials. The III-N device can be designed to operate as an enhancement-mode (E-mode) transistor device, such that the threshold voltage of the device (i.e., the minimum voltage that must be applied to the gate relative to the source in order to turn the device on) is positive. Alternatively, the III-N device can be a depletion-mode (D-mode) device, having a negative threshold voltage. The III-N device can be a high-voltage device suitable for high voltage applications. In such a high-voltage device, when the device is biased off (e.g., the voltage on the gate relative to the source is less than the device threshold voltage), it is at least capable of supporting all source-drain voltages less than or equal to the high-voltage in the application in which the device is used, which for example may be 100V, 300V, 600V, 1200V, 1700V, or higher. When the high voltage device is biased on (e.g., the voltage on the gate relative to the source is greater than the device threshold voltage), it is able to conduct substantial current with a low on-voltage. The maximum allowable on-voltage is the maximum voltage that can be sustained in the application in which the device is used.

Bridgeless power factor correction circuits are described herein. In particular implementations, methods and configurations for sensing the boost inductor current are described. The details of one or more disclosed implementations of the subject matter described in this specification are set forth in the accompanying drawings and the description below. Other features, aspects, and advantages will become apparent from the description, the drawings, and the claims.

DESCRIPTION OF DRAWINGS

FIGS. 2A-2D illustrate the fundamental operating principles of the PFC circuit of FIG. 1B.

FIG. 7 is an exploded view of an example PCB board that a PFC circuit can be mounted on.

Like reference symbols in the various drawings indicate like elements.

DETAILED DESCRIPTION

Figure 1A:
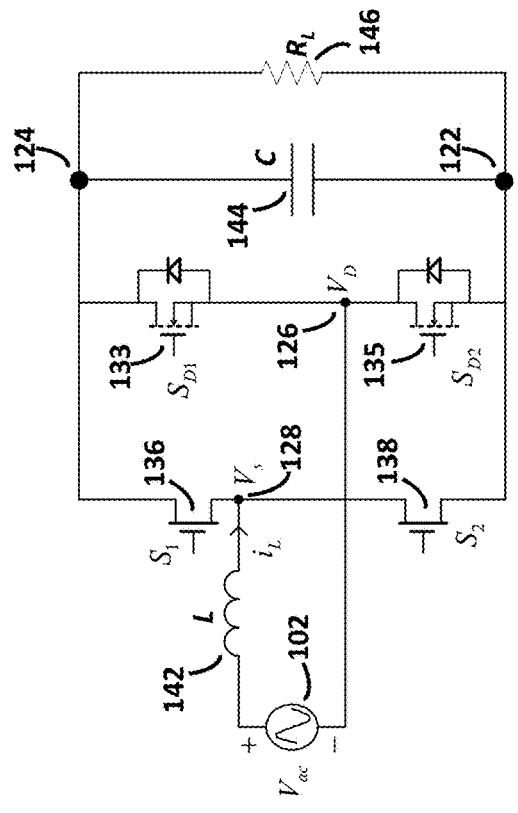
FIGS. 1A and 1B are circuit schematics of Totem Pole bridgeless power factor correction (PFC) circuits.
Figure 1B:
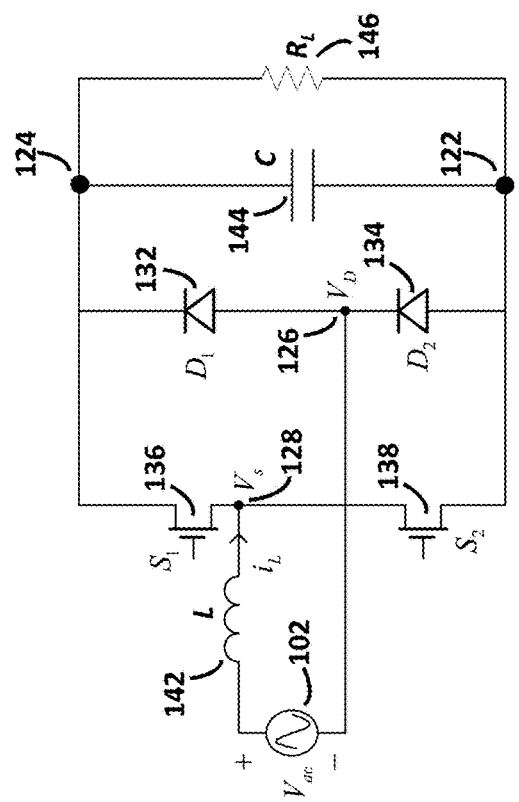

FIGS. 1A and 1B illustrate circuit schematics of Totem Pole bridgeless power factor correction (PFC) circuits. In the PFC circuit of FIG. 1A, the AC input voltage supply 102 ($V_{ac}$) is at one end electrically connected to a node 126 ($V_D$) between diodes 132 ($D_1$) and 134 ($D_2$) and at an opposite end electrically connected to or electrically coupled to the first end of an inductive component 142 (L), e.g., an input inductor or boost inductor. The opposite end of the inductive component 142 is electrically connected to or electrically coupled to a node 128 (Vs) between active switches 136 ($S_1$) and 138 ($S_2$). The anode of diode 134 and the source of switch 138 are electrically connected to or electrically coupled to a low side node 122 of the circuit. The cathode of diode 132 and the drain of switch 136 are electrically connected to or electrically coupled to a high side node 124 of the circuit. The output capacitor 144 (C) which is charged by the circuit also has a first end connected to the high side node 124 and an opposite end connected to the low side node 122. The circuit of FIG. 1A utilizes diodes 132 and 134 for line frequency rectification. The circuit of FIG. 1B is the same as that of FIG. 1A, except that diodes 132 and 134 are replaced by switches 133 ($S_{D1}$) and 135 ($S_{D2}$) so that line frequency synchronous rectification can be performed, thereby decreasing losses and improving circuit efficiency.

Figure 2A:
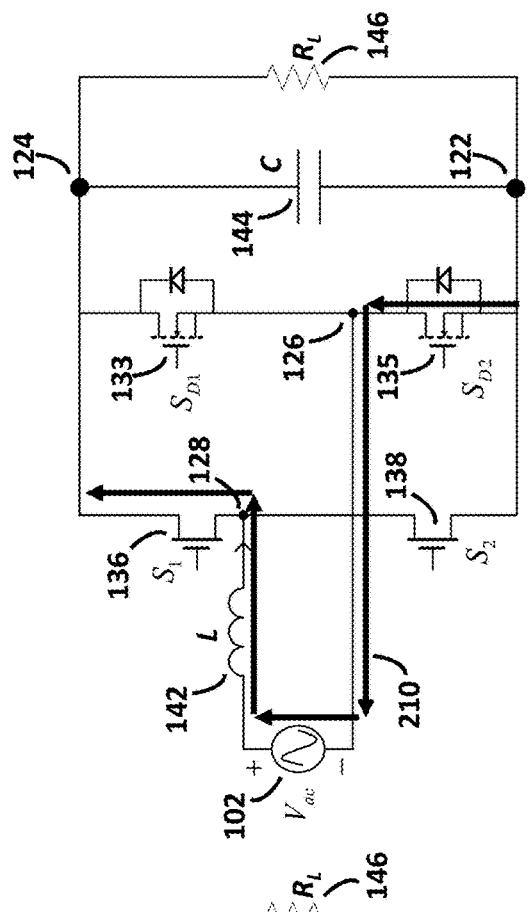
Figure 2B:
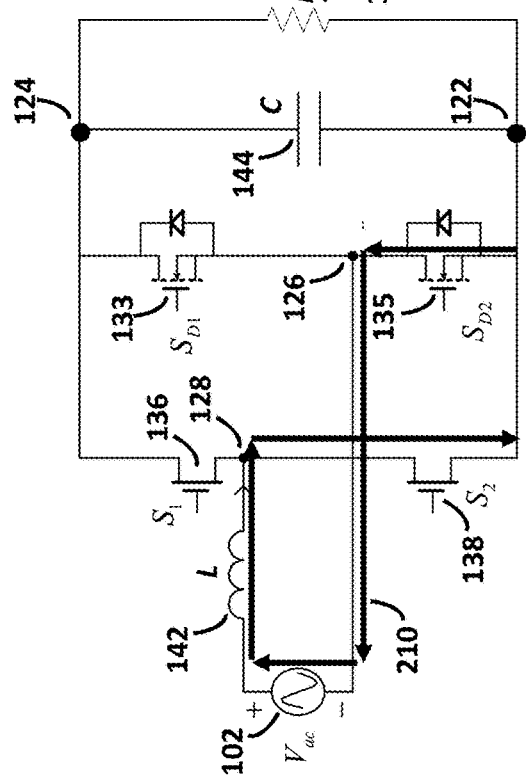

FIGS. 2A-2B illustrate the fundamental operating principles of the PFC circuit of FIG. 1B during the positive AC line half-cycle, while current flows from the AC voltage supply 102 into the inductive component 142. During the positive AC line half-cycle, current 210 flows from low side node 122 up through switch 135, and then through the AC voltage supply 102 and the inductive component 142. During this cycle, switch 133 is biased OFF, and switch 135 may be biased ON or OFF, although it is preferable for switch 135 to be biased ON in order to reduce conduction losses through the switch. Switch 138 is actively switched in order to control whether the current flows back down to node 122 (as in FIG. 2A) or up to node 124 and charges the capacitor 144 (as in FIG. 2B). As illustrated in FIG. 2A, when switch 136 is biased OFF (i.e., the gate of switch 136 is biased relative to the source of switch 136 at a voltage that is less than the threshold voltage of switch 136) and switch 138 is biased ON (i.e., the gate of switch 138 is biased relative to the source of switch 138 at a voltage that is larger than the threshold voltage of switch 138), the current 210 flows downward through switch 138, and switch 136 blocks a voltage which is about equal to the voltage difference between nodes 124 and 122. Referring to FIG. 2B, when switch 138 is switched OFF, the current flows upwards through switch 136, and switch 138 blocks a voltage which is about equal to the voltage difference between nodes 124 and 122. After switch 138 has been switched OFF and while current flows through switch 136, switch 136 may be switched ON in order to reduce conduction losses through switch 136.

FIGS. 2C-2D illustrate the fundamental operating principles of the PFC circuit of FIG. 1B during the negative AC line half-cycle, while current 210 flows from the inductive component 142 into the AC voltage supply 102. During the negative AC line half-cycle, current 210 flows through the inductive component 142 into the AC voltage supply 102, and then upwards through switch 133. During this cycle, switch 135 is biased OFF, and switch 133 may be biased ON or OFF, although it is preferable for switch 133 to be biased ON in order to reduce conduction losses through the switch. Switch 136 is actively switched in order to control whether the current flowing into the inductive component 142 flows upwards from node 122 through switch 138 (as in FIG. 2D) and charges the capacitor 144, or downwards from node 124 through switch 136 (as in FIG. 2C). As illustrated in FIG. 2C, when switch 138 is biased OFF and switch 136 is biased ON, the current 210 flows downward through switch 136, and switch 138 blocks a voltage which is about equal to the voltage difference between nodes 124 and 122. Referring to FIG. 2D, when switch 136 is switched OFF, the current 210 flows upwards through switch 138, and switch 136 blocks a voltage which is about equal to the voltage difference between nodes 124 and 122. After switch 136 has been switched OFF and while current 210 flows through switch 138, switch 138 may be switched ON in order to reduce conduction losses through switch 136.

Referring to the PFC circuit of FIGS. 1B and 2A-2D, node 122 functions as the reference ground for the DC output voltage of the PFC circuit (i.e., the voltage across the capacitor 144), and node 124 functions as the DC high voltage node. The voltage between nodes 124 and 122 is then utilized as a DC output voltage to power the load 146 ($R_L$). In some implementations, node 122 is connected to an earth ground, while in other implementations it is left floating and functions as a floating reference ground.

The voltage signals applied to the gates of switches 136 and 138 are provided by a first DC voltage supply. In the case of switch 136, the voltage from the first DC voltage supply applied to the gate of switch 138, is referenced to the reference ground (node 122).

In order for the PFC circuit of FIGS. 1B and 2A-2D to operate properly, the switches 136 and 138 control the input current to be in phase with the AC input voltage. To achieve this operation, it may be necessary to sense the input current 210.

Figure 3:
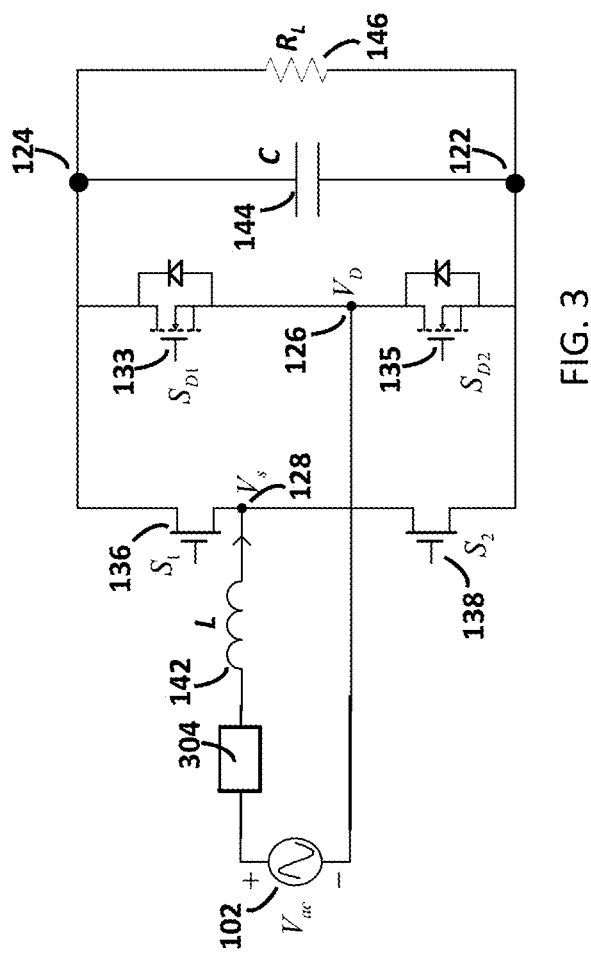
FIGS. 3-4 are circuit schematics of bridgeless PFC circuits which are configured to allow for sensing of the inductor current.

Referring now to FIG. 3, a first method of sensing the inductor current includes connecting a high bandwidth isolated current sensor 304, such as a Hall sensor, in series with the inductive component 142 (e.g., between the AC voltage supply 102 and the inductor 142). However, Hall sensors tend to be very expensive and have a limited bandwidth, and so a more cost-efficient and agile solution may be desirable. The sensor 304 could alternatively be a current transformer (CT). However, due to the 50/60 Hz line current, the magnetic core of the CT will be very large and expensive, and could still have saturation problems if there is an imbalance in the AC line current.

Figure 4:
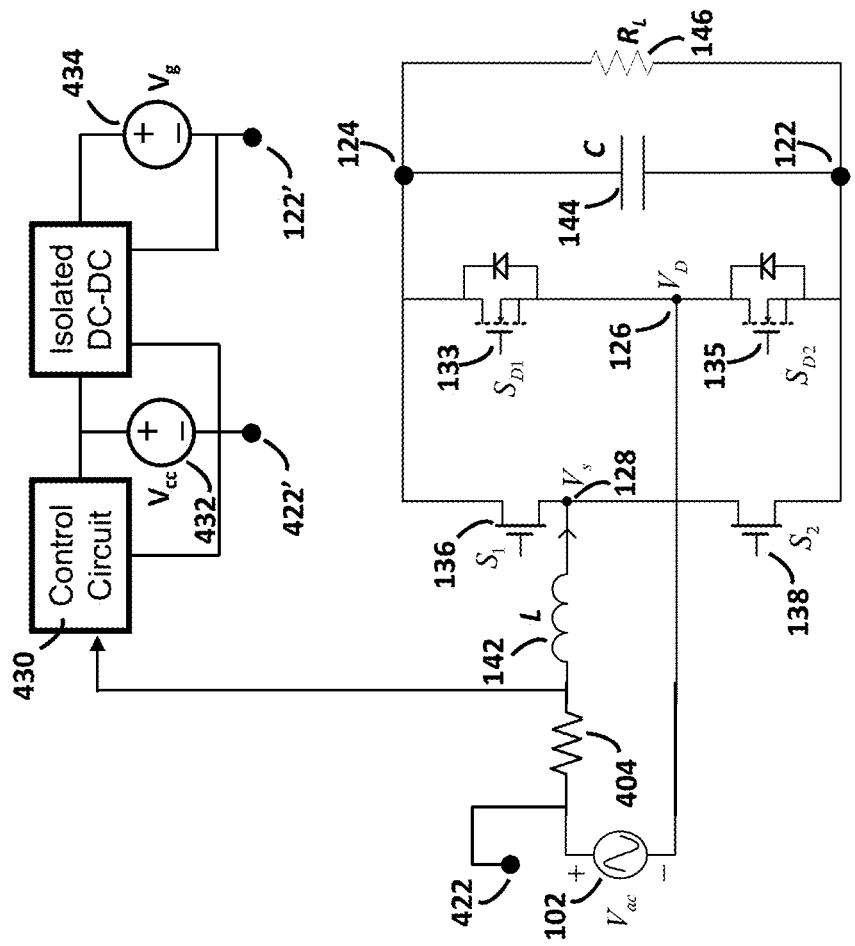

FIG. 4 illustrates a second configuration for sensing the inductor current. In the configuration of FIG. 4, a resistor 404 is placed in series with the inductive component 142 and the AC voltage supply 102 (e.g., between the AC voltage supply 102 and the inductor 142), and the voltage across the resistor 404 is amplified and sensed by a control circuit 430. However, due to the positioning of the resistor 404 in the circuit, sensing the absolute voltage at the node between the resistor 404 and inductive component 142 (relative to reference ground 122) does not result in a meaningful measurement for determining the inductor current. Instead, a second reference ground 422 (also referred to as a control ground) which is electrically isolated from the reference ground 122 is provided on an opposite side of the resistor 404 from the control circuit 430. An amplifier (not shown) within the control circuit 430 is powered by a voltage supply 432 ($V_{cc}$) which is coupled (or referenced) to the second reference ground 422 (via node 422', which is electrically connected to node 422), and the voltage supply 434 ($V_g$) which supplies control signals to the gate of switch 138 is coupled (or referenced) to the first reference ground 122 (via node 122', which is electrically connected to node 122).

Figure 5:
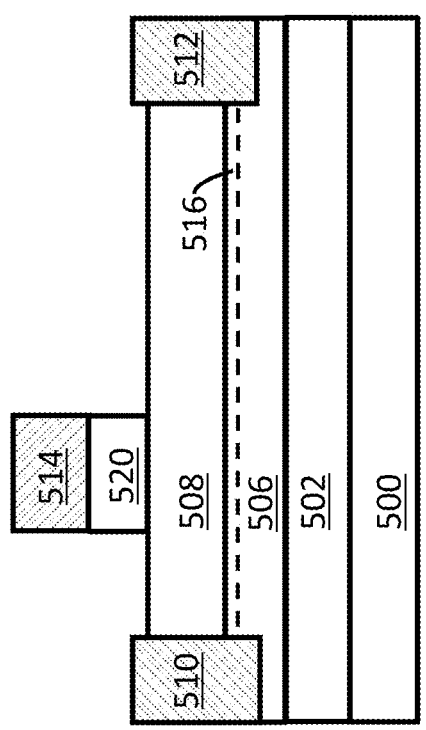
FIG. 5 is a cross-sectional view of a III-N transistor.

In order to achieve high performance and high circuit efficiency, switches 136 and 138 can be provided as devices that have low reverse recovery charge $Q_{rr}$ and are capable of being switched at high frequencies. For example, switches 136 and 138 can be capable of being switched at frequencies of at least 50 kHz, at least 80 kHz, or at least 100 kHz without sustaining substantial switching losses. Traditional high power switching devices which are capable of blocking high voltages, such as IGBT's and power MOSFETs, which are typically silicon-based devices, experience switching losses at these frequencies that are greater than can be tolerated. These devices also inherently include parasitic diodes anti-parallel to their channels. On the other hand, III-Nitride or III-N field effect transistors, such as the III-N HEMT shown in FIG. 5, are capable of blocking the required high voltages while inherently being capable of higher switching speeds than a traditional IGBT or power MOS device. High voltage III-N devices, for example III-N HEMTs, have lower reverse recovery charge in their semiconductor portions, as well as lower junction capacitances as compared to traditional IGBTs or power MOSFETs. They have been demonstrated to be capable of switching at frequencies which are in some cases at least as high as 1 MHz (1000 kHz), but typically greater than 80 kHz, greater than 100 kHz, greater than 300 kHz, or greater than 500 kHz, depending on the specific design.

In some implementations switches 136 and 138 are III-N devices, such as the III-N high electron mobility transistor (HEMT) illustrated in FIG. 5. A typical III-Nitride HEMT, which is illustrated in FIG. 5, includes a substrate 500 (e.g., a silicon substrate), a III-N buffer layer 502 formed of a III-N semiconductor material such as AN or AlGaN, a III-N channel layer 506 formed of a III-N semiconductor material such as GaN, a III-N barrier layer 508 formed of a III-N semiconductor material (e.g., AlGaN or AN) having a larger bandgap than that of the III-N channel layer 506, and a two-dimensional electron gas (2DEG) channel 516 formed in the III-N channel layer 506 adjacent to the III-N barrier layer 508, the 2DEG channel 516 serving as the conductive channel of the transistor. The III-N HEMT further includes source and drain contacts 510 and 512, respectively, which contact the 2DEG channel 516. A gate electrode 514, which is deposited between the source and drain contacts 510 and 512, is used to modulate the conductivity of the channel in the region directly below the gate electrode 514. Optionally, a gate insulator 520 is included between the gate electrode 514 and the underlying III-N semiconductor materials.

In some implementations, the III-N HEMT of FIG. 5 is an enhancement-mode device, having a threshold voltage greater than 0V. That is, in order to turn the device ON, a sufficiently positive voltage (e.g., greater than the device threshold voltage) must be applied to the gate 514 relative to the source 510. When 0V is applied to the gate 514 relative to the source, the device is in the OFF state.

Figure 6B:
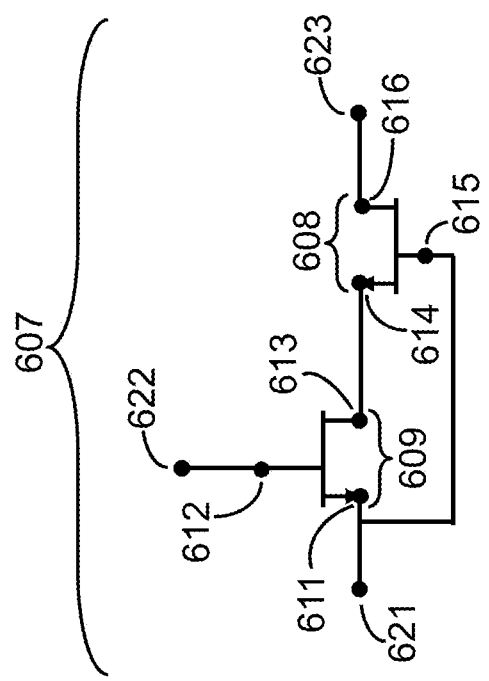
FIGS. 6A and 6B illustrate a plan view (top view) and circuit schematic, respectively, of a hybrid electronic device.
Figure 6A:
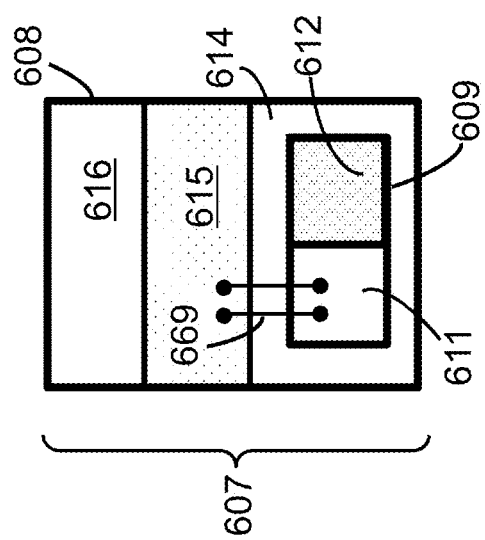

Other devices which can inherently be switched at high frequencies could alternatively be used for switches 136 and 138. For example, a hybrid device 607, shown in FIGS. 6A and 6B, could be used for switches 136 and 138. Although the switches 136 and 138 could be depletion-mode (D-mode) devices, it is often preferable that switches 136 and 138 be enhancement-mode or E-mode devices. That is, the switch is in the OFF state when the control terminal is held at the same voltage as the low-side terminal, and is turned ON by switching the voltage at the control terminal to a sufficiently high positive voltage relative to the low-side terminal. Since single high-voltage enhancement-mode transistors can be difficult to fabricate reliably, one alternative to a single high-voltage E-mode transistor is to combine a high-voltage depletion-mode transistor 608 with a low-voltage E-mode transistor 609 in the configuration of FIGS. 6A and 6B to form a hybrid device 607. Hybrid device 607 can be operated in the same way as a single high-voltage E-mode transistor, and in many cases achieves the same or similar output characteristics as a single high-voltage E-mode transistor. FIG. 6A shows a plan view schematic diagram of hybrid device 607, and FIG. 6B shows a circuit schematic of hybrid device 607. Hybrid device 607 includes a high-voltage D-mode transistor 608 and a low-voltage E-mode transistor 609. In the configuration illustrated in FIGS. 6A and 6B, E-mode transistor 609 is a vertical transistor, having its drain electrode 613 on the opposite side of the device from its source electrode 611 and gate electrode 612, and D-mode transistor 608 is a lateral transistor, having its source electrode 614, gate electrode 615, and drain electrode 616 all on the same side of the device. However, other configurations for each of transistors 608 and 609 are possible as well.

The source electrode 611 of the low-voltage E-mode transistor 609 and the gate electrode 615 of the high-voltage D-mode transistor 608 are both electrically connected together, for example with wire bonds 669, and together form the source 621 of the hybrid device 607. The gate electrode 612 of the low-voltage E-mode transistor 609 forms the gate 622 of the hybrid device 607. The drain electrode 616 of the high-voltage D-mode transistor 608 forms the drain 623 of the hybrid device 607. The source electrode 614 of the high-voltage D-mode transistor 608 is electrically connected to the drain electrode 613 of the low-voltage E-mode transistor 609. As seen in FIG. 6A, drain electrode 613, which is on the opposite side of the E-mode transistor 609 from the source and drain electrodes 611 and 612, respectively, can be electrically connected to source electrode 614 by mounting the low-voltage E-mode transistor 609 directly on top of the source electrode 614 with the drain electrode 613 directly contacting the source electrode 614, for example by using a conductive solder or resin. As such, the footprint (and therefore the cross-sectional area) of the low-voltage E-mode transistor 609 can be smaller than that of the high-voltage D-mode transistor 608, and in particular the footprint of the low-voltage E-mode transistor 609 can be smaller than that of the source electrode 614 of high-voltage D-mode transistor 608.

As used herein, a "hybrid enhancement-mode electronic device or component", or simply a "hybrid device or component", is an electronic device or component formed of a depletion-mode transistor and an enhancement-mode transistor, where the depletion-mode transistor is capable of a higher operating and/or breakdown voltage as compared to the enhancement-mode transistor, and the hybrid device or component is configured to operate similarly to a single enhancement-mode transistor with a breakdown and/or operating voltage about as high as that of the depletion-mode transistor. That is, a hybrid enhancement-mode device or component includes at least 3 nodes having the following properties. When the first node (source node) and second node (gate node) are held at the same voltage, the hybrid enhancement-mode device or component can block a positive high voltage (i.e., a voltage larger than the maximum voltage that the enhancement-mode transistor is capable of blocking) applied to the third node (drain node) relative to the source node. When the gate node is held at a sufficiently positive voltage (i.e., greater than the threshold voltage of the enhancement-mode transistor) relative to the source node, current passes from the source node to the drain node or from the drain node to the source node when a sufficiently positive voltage is applied to the drain node relative to the source node. When the enhancement-mode transistor is a low-voltage device and the depletion-mode transistor is a high-voltage device, the hybrid component can operate similarly to a single high-voltage enhancement-mode transistor. The depletion-mode transistor can have a breakdown and/or maximum operating voltage that is at least two times, at least three times, at least five times, at least ten times, or at least twenty times that of the enhancement-mode transistor.

As used herein, a "high-voltage device", such as a high-voltage transistor, is an electronic device which is optimized for high-voltage switching applications. That is, when the transistor is off, it is capable of blocking high voltages, such as about 300V or higher, about 600V or higher, about 1200V or higher, or about 1700V or higher, and when the transistor is on, it has a sufficiently low on-resistance ($R_{ON}$) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300V, 600V, 1200V, 1700V, or other suitable blocking voltage required by the application. In other words, a high-voltage device can block any voltage between 0V and at least $V_{max}$, where $V_{max}$ is the maximum voltage that could be supplied by the circuit or power supply. In some implementations, a high-voltage device can block any voltage between 0V and at least $2*V_{max}$. As used herein, a "low-voltage device", such as a low-voltage transistor, is an electronic device which is capable of blocking low voltages, such as between 0V and $V_{low}$ (where $V_{low}$ is less than $V_{max}$), but is not capable of blocking voltages higher than $V_{low}$. In some implementations, $V_{low}$ is equal to about $|V_{th}|$, greater than $|V_{th}|$, about $2*|V_{th}|$, about $3*|V_{th}|$, or between about $|V_{th}|$ and $3*|V_{th}|$, where $|V_{th}|$ is the absolute value of the threshold voltage of a high-voltage transistor, such as a high-voltage-depletion mode transistor, contained within the hybrid component in which a low-voltage transistor is used. In other implementations, $V_{low}$ is about 10V, about 20V, about 30V, about 40V, or between about 5V and 50V, such as between about 10V and 40V. In yet other implementations, $V_{low}$ is less than about $0.5*V_{max}$, less than about $0.3*V_{max}$, less than about $0.1*V_{max}$, less than about $0.05*V_{max}$, or less than about $0.02*V_{max}$.

In the hybrid device 607 of FIGS. 6A and 6B, while the high-voltage D-mode transistor 608 typically lacks a parasitic diode anti-parallel to the channel, the low-voltage E-mode transistor 609 may include an intrinsic parasitic anti-parallel diode. Or, an external diode can be connected anti-parallel to the channel. In the case where transistor 609 includes an intrinsic parasitic anti-parallel diode but without an external diode connected in parallel to the parasitic diode, hybrid device 607 operates as follows. In a first mode of operation, when voltage at the drain 623 of the hybrid device (i.e., the drain 616 of D-mode transistor 608) is higher than voltage at the source 621 of the hybrid device (i.e., the source 611 of E-mode transistor 609) and the gate 622 of the hybrid device (i.e., the gate of E-mode transistor 609) is biased relative to the source 621 at a voltage below the threshold voltage of E-mode transistor 609 (i.e., the gate is biased OFF), the hybrid device 607 blocks the drain-source voltage that is across the device. In this mode of operation, the drain source voltage may be as high as (Vs2)/2, and can be even higher immediately after switching due to ringing. In a second mode of operation, when voltage at the drain 623 of the hybrid device is higher than voltage at the source 621 of the hybrid device, and the gate 622 of the hybrid device is biased relative to the source 621 at a voltage above the threshold voltage of E-mode transistor 609 (i.e., the gate is biased ON), the hybrid device conducts substantial current from the drain 623 of the hybrid device to the source 621 of the hybrid device (i.e., in a first direction) through the channels of both transistors 608 and 609. In a third mode of operation, when voltage at the drain 623 of the hybrid device is lower than voltage at the source 621 of the hybrid device, and the gate 622 is biased relative to the source 621 at a voltage below the transistor threshold voltage (i.e., the gate is biased OFF), the hybrid device conducts substantial current from the source 621 of the hybrid device to the drain 623 of the hybrid device (i.e., in a second direction). In this mode of operation, the current conducts through the channel of D-mode transistor 608 and through the parasitic diode of E-mode transistor 609. Since E-mode transistor 609 is a low voltage device, conduction and switching losses incurred due to switching on of the parasitic diode are not as high as those incurred for conduction through a parasitic diode of a high voltage transistor. However, this third mode of operation can still result in conduction losses being too high, and so a fourth mode of operation can be achieved as follows. While the hybrid device is operated in the third mode of operation described above, the gate 622 of the hybrid device is switched ON (i.e., to a voltage that is greater than the hybrid device threshold voltage relative to the voltage at its source). In this fourth mode of operation, current continues to flow through the channel of the D-mode transistor 608 in the second direction, but current in the E-mode transistor 609 flows through the transistor channel rather than through the parasitic diode. Hence, conduction losses are reduced relative to the third mode of operation.

In a hybrid device in which an external diode is connected anti-parallel to the channel (not shown), the external diode performs the same function as the parasitic diode in the four modes of operation described above.

In FIGS. 6A and 6B, D-mode transistor 608 can be a III-Nitride transistor, such as a III-N HEMT, and E-mode transistor 609 can be a Silicon-based device, such as a Si MOSFET. Alternatively, E-mode transistor 609 can be a III-N transistor as well. Because E-mode transistor 609 is a low-voltage device, and therefore does not need to be capable of blocking the entire circuit high voltage, it can be made to switch much faster than a high-voltage device formed of the same material.

Referring back to FIG. 4, in order to properly sense the inductor current, the bandwidth of the amplifier in the control circuit 430 typically needs to be greater than the switching frequency of switches 136 and 138, for example at least three times the switching frequency of switches 136 and 138. As previously described, it can be preferable for switches 136 and 138 to be switches at high frequencies. For example, the switching frequency of switches 136 and 138 can be at least 50 kHz, and the amplifier of the control circuit 430 can have a bandwidth of at least 120 kHz or at least 150 kHz. However, the larger the bandwidth of the amplifier, the higher the noise. Higher levels of noise require the current sensing resistor 404 to be larger, which can lead to higher losses in the circuit, as further described below.

It is generally preferable for the current sensing resistor 404 to be as small as possible in order to reduce power loss through the resistor 404. However, in order for the current to be properly sensed, the resistor 404 must be large enough that the root mean squared (rms) voltage across the resistor (which is equal to the product of the resistance of resistor 404 and the rms inductor current) can be accurately measured by the control circuit 430. For a given bandwidth of the amplifier of control circuit 430 (which is selected according to the switching frequency of switches 136 and 138), there is a minimum rms voltage across resistor 404 that can be accurately measured by control circuit 430. Selecting a higher bandwidth amplifier for control circuit 430 increases the noise in the system, and thus necessitates a larger rms voltage drop across resistor 404 in order to obtain an accurate measurement of the inductor current.

As an example, for a bridgeless PFC circuit in which the switches 136 and 138 are switched at a frequency of 50 kHz, the amplifier in control circuit 430 has a bandwidth of 150 kHz, and the rms inductor current during operation of the circuit is 0.2 Amps, the resistor 404 can typically be in the range of about 2 milli-ohms to 20 milli-ohms, for example about 10 milli-ohms, resulting in an rms voltage across the resistor 404 of between 0.4 mV and 4 mV, for example about 2 mV. If a resistor smaller than about 2 milli-ohms is used, the control circuit 430 may not be capable of accurately sensing the inductor current. If a larger resistor is used, than additional power loss through the resistor 430 is incurred. If a larger rms current is used, for example because the PFC circuit is designed to deliver higher power to the load 146, than a smaller resistor 404 may also be used.

If the amplifier in control circuit 430 is selected to have a higher bandwidth, which may be necessary if higher switching frequencies for switches 136 and 138 are used, than the minimum rms voltage across resistor 404 that can be accurately measure will be larger, and thus for the same rms current, a larger resistor 404 must be used. In some implementations of the circuit of FIG. 4, switches 136 and 138 are switched at a frequency of at least 50 kHz, and the resistance of resistor 404 is less than 50 milli-ohms, for example between 5 and 50 milli-ohms.

Figure 7:
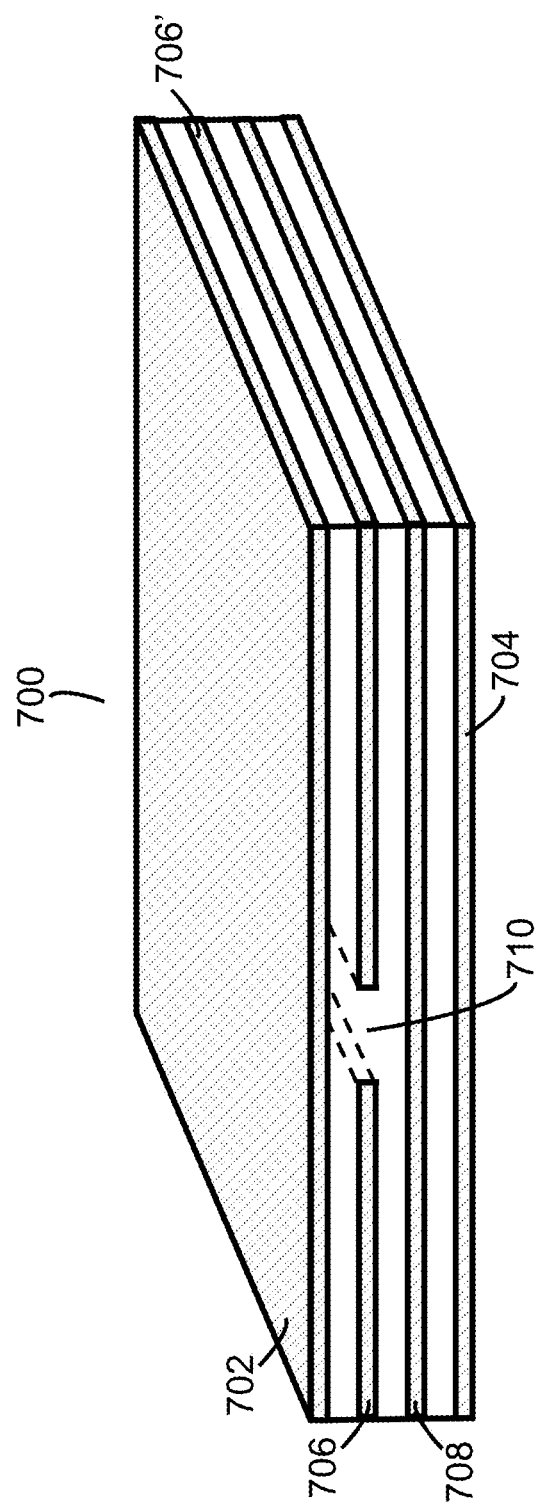

The entire circuit of FIG. 4 can be formed on a single printed circuit board (PCB), for example a 4-layer PCB or a 6-layer PCB. An example 4-layer PCB board 700 on which the circuit of FIG. 4 can be formed is illustrated in FIG. 7. The PCB board 700 includes 4 metal layers 702, 704, 706, and 708, separated from one another by insulating material. Although not shown, layers 702 and 704 can be patterned to form metal trace interconnects between components mounted on the top and/or the bottom of the PCB board. Layer 708 can be a DC power plane, and can be electrically connected to node 124 of FIG. 4. A trench can be etched through layer 706, which separates layer 706 into two planes (labeled 706 and 706') which are electrically isolated from one another. Plane 706 can serve as a first ground plane for reference ground 122 in FIG. 4, and plane 706' can serve as a second ground plane for reference ground 422 in FIG. 4.

Although not shown in FIG. 4, the circuit can be rearranged such that the connections to reference ground 422 and to the control circuit 430 are reversed. That is, the reference ground 422 could alternatively be connected to the node between the resistor 404 and the inductive component 142, with the control circuit 430 coupled to the node between the resistor 404 and the AC voltage supply 102.

Figure 8:
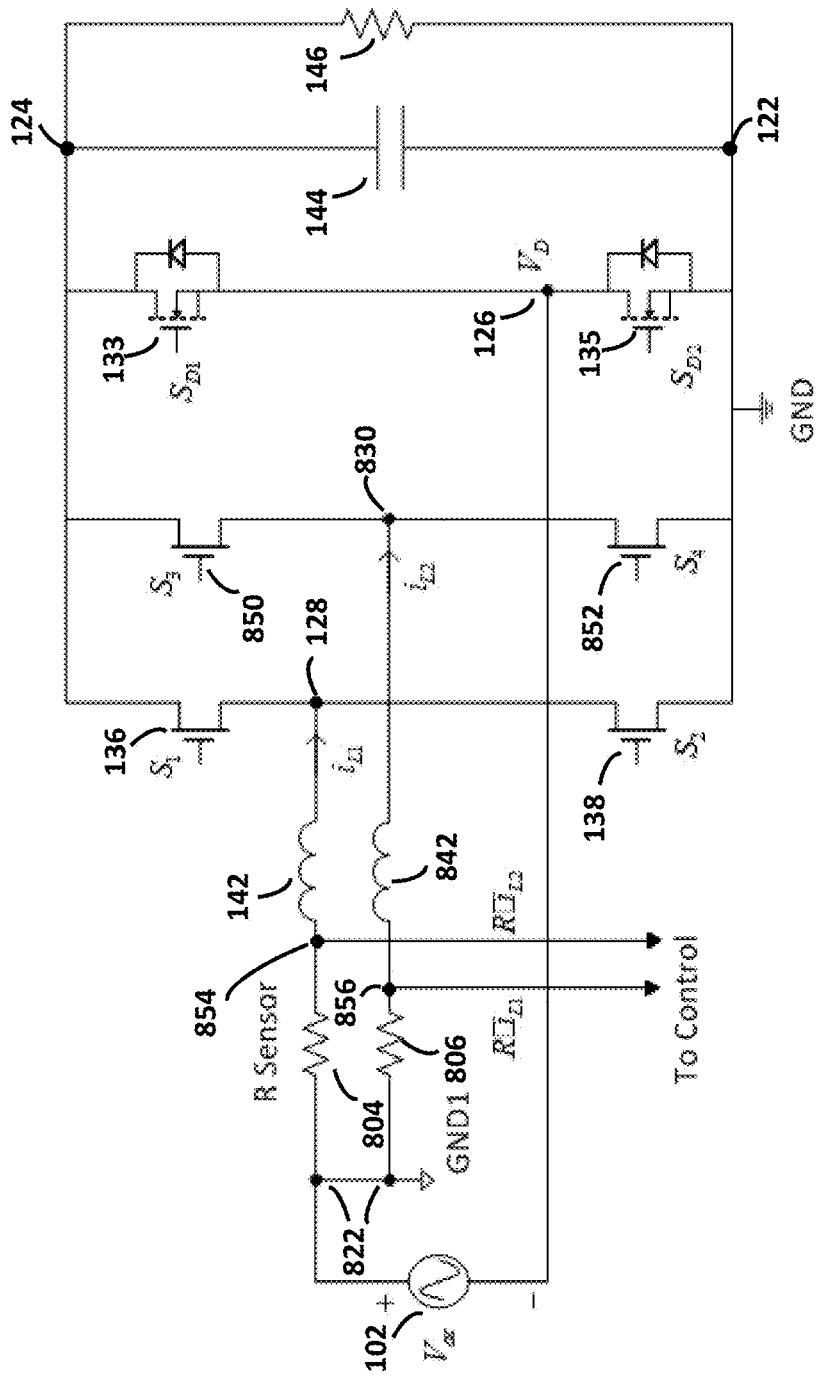
FIGS. 8-10 are circuit schematics of bridgeless PFC circuits which are configured to allow for sensing of the inductor current.

Using a similar configuration to that of FIG. 4, current can also be sensed in a two-phase or three-phase interleaved Totem Pole PFC circuit. Such a configuration for a two-phase PFC is shown in FIG. 8. As seen in FIG. 8, the reference ground 822 for the current sensing circuit (labeled GND1) is connected to a pair of current sensing resistors 804 and 806, each of which is connected to its own inductive component 142 and 842, respectively. The first inductive component 142 is connected to the node 128 between switches 136 and 138, while the second inductive component 842 is connected to the node 830 between switches 850 and 852. The node 854 between the first inductive component 142 and its associated resistor 804, as well as the node 856 between the second inductive component 842 and its associated resistor 806, are both coupled to the control circuit, which is used to sense the currents passing through both inductors.

Figure 9:
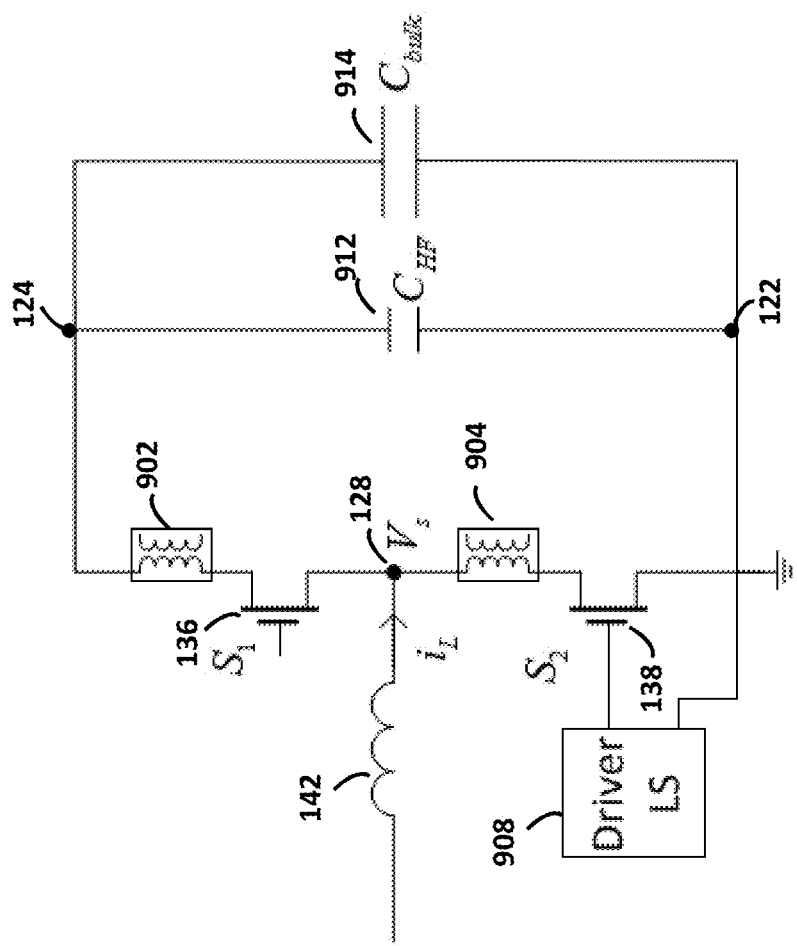
Figure 10:
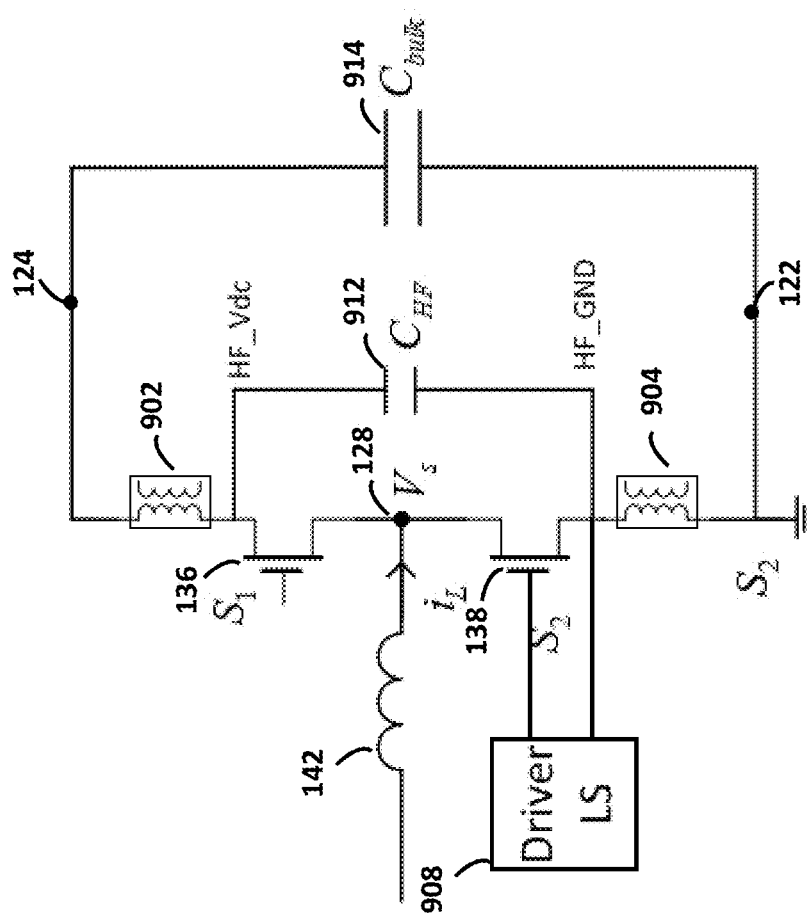

Another way to sense the inductor current in a Totem Pole PFC circuit is to sense the high-frequency pulse currents in switches 136 and 138. By summing these current waveforms, the boost inductor current can be reconstructed. This configuration is illustrated in FIGS. 9-10. As seen in FIG. 9, AC current sensors 902 and 904 (e.g., current transformers or Rogowski Coils) can be connected in series with each of switches 136 and 138. Because the currents flowing through switches 136 and 138 are high frequency current pulses, the AC current sensors 902 and 904 can be small sized high frequency AC current sensors. As shown in FIG. 9, the two sensors can be placed on the drain side of their respective switches 136 and 138, so that the inductance on the sensing coil does not interfere with the driving circuit.

However, the sensor placement of FIG. 9 may not work in a III-N HEMT-based diode-free bridge. First of all, due to the extremely fast switching speed of III-N based switching devices 136 and 138, unlike conventional power switches (MOSFET, IGBT), the III-N HEMT based bridge may not be able to tolerate excessive inductance introduced by the sensors. The III-N HEMT based bridge may not function properly and/or may not switch properly in such an arrangement. Secondly, high reverse recovery current will flow through the current sensor for a few nanoseconds during the reverse recovery time of the III-N HEMTs. This short, high reverse recovery current pulse may disrupt the proper function of the current sensors.

An alternative configuration for sensing the high-frequency pulse currents in switches 136 and 138 is shown in FIG. 10. One or more high frequency decoupling capacitors 912 ($C_{HF}$) are placed very close to the III-N HEMT based switches, with one end of the capacitor(s) 912 connected to the drain of 136 and an opposite end of capacitor(s) 912 connected to the source of switch 138. The AC current sensors 902 and 904 are placed outside of this high frequency DC-link. In this configuration, the switching of the III-N HEMT based switches is not affected by the parasitic inductances introduced by the two current sensors, as the high reverse recovery pulse currents are drawn from the high frequency decoupling capacitor(s) 912 so that the current sensors will not pick up this high disruptive current. The current sensors 902 and 904, however, sense all the switching frequency current for control purposes. The high frequency capacitor(s) 912 can have a substantially smaller capacitance than the DC output capacitor 914 (labelled $C_{bulk}$ in FIGS. 9-10).

A number of implementations have been described. Nevertheless, it will be understood that various modifications may be made without departing from the spirit and scope of the invention. Accordingly, other embodiments are within the scope of the following claims.

What is claimed is:

1. An electronic circuit, comprising:
a first III-N based switch and a second III-N based switch, wherein a source of the first III-N based switch is coupled to a first reference ground and a drain of the second III-N based switch is coupled to a DC high voltage node; and
an inductive component connected in series with a resistor and coupled to a node between the first and second III-N based switches; wherein
a first side of the resistor is coupled to a second reference ground which is electrically isolated from the first reference ground, and a second side of the resistor is coupled to a control circuit, the control circuit also being coupled to the second reference ground.

2. The electronic circuit of claim 1, wherein the electronic circuit is a power factor correction circuit.

3. The electronic circuit of claim 1, wherein the control circuit is configured to measure current flowing through the inductive component during operation of the electronic circuit.

4. The electronic circuit of claim 1, wherein the control circuit is configured to measure voltage at the second side of the resistor relative to the second reference ground.

5. The electronic circuit of claim 1, further comprising a printed circuit board including a first metal layer between a second metal layer and a third metal layer, wherein a trench is formed in the first metal layer, the trench separating the first metal layer into first and second portions which are electrically isolated from one another.

6. The electronic circuit of claim 5, wherein the first portion of the first metal layer serves as a ground plane for the first reference ground, and the second portion of the first metal layer serves as a ground plane for the second reference ground.

7. The electronic circuit of claim 1, wherein a resistance of the resistor is less than 50 milli-ohms.

8. The electronic circuit of claim 7, wherein the first and second III-N based switches are each configured to be switched at a frequency of at least 50 kHz.

9. The electronic circuit of claim 1, wherein the control circuit comprises an amplifier powered by a voltage supply which is coupled to the second reference ground.

10. The electronic circuit of claim 9, wherein the amplifier has a bandwidth that is greater than a switching frequency of each of the first and second III-N based switches.

11. A method of sensing current in a power factor correction circuit, the power factor correction circuit comprising:
a first III-N based switch and a second III-N based switch, wherein a source of the first III-N based switch is coupled to a first reference ground and a drain of the second III-N based switch is coupled to a DC high voltage node; and
an inductive component connected in series with a resistor and coupled to a node between the first and second III-N based switches, wherein a first side of the resistor is coupled to a second reference ground which is electrically isolated from the first reference ground, and a second side of the resistor is coupled to a control circuit, the control circuit including an amplifier which is also coupled to the second reference ground and has a bandwidth that is greater than a switching frequency of each of the first and second III-N based switches; the method comprising amplifying a voltage across the resistor; and having the control circuit measure the voltage across the resistor.

12. The method of claim 11, wherein a resistance of the resistor is less than 50 milli-ohms.

13. The method of claim 12, wherein the first and second III-N based switches are each configured to be switched at a frequency of at least 50 kHz.

14. The method of claim 13, wherein the amplifier has a bandwidth that is greater than the switching frequency of each of the first and second III-N based switches.

15. An electronic circuit, comprising:
a first III-N based switch and a second III-N based switch, wherein a source of the first III-N based switch is coupled to a first reference ground and a drain of the second III-N based switch is coupled to a DC high voltage node;
a third III-N based switch and a fourth III-N based switch, wherein a source of the third III-N based switch is coupled to the first reference ground and a drain of the fourth III-N based switch is coupled to the DC high voltage node;
a first inductive component connected in series with a first resistor and coupled to a node between the first and second III-N based switches; and
a second inductive component connected in series with a second resistor and coupled to a node between the third and fourth III-N based switches; wherein
a first side of the first resistor and a first side of the second resistor are each coupled to a second reference ground which is electrically isolated from the first reference ground; and
a second side of the first resistor and a second side of the second resistor are each coupled to a control circuit, the control circuit also being coupled to the second reference ground.

16. The electronic circuit of claim 15, wherein the electronic circuit is a power factor correction circuit.

17. The electronic circuit of claim 16, wherein the power factor correction circuit is a multi-phase power factor correction circuit.

18. The electronic circuit of claim 15, wherein the control circuit is configured to measure current flowing through the inductive component during operation of the electronic circuit.

19. The electronic circuit of claim 15, wherein the control circuit comprises an amplifier powered by a voltage supply which is coupled to the second reference ground.

20. The electronic circuit of claim 19, wherein the amplifier has a bandwidth that is greater than a switching frequency of each of the first, second, third, and fourth III-N based switches.

* * * * *